(12) United States Patent
Park (10) Patent No.: US 8,067,985 B2
(45) Date of Patent: *Nov. 29, 2011

(54) RESONANT OPERATING MODE FOR A TRANSISTOR

(76) Inventor: Larry A. Park, Manning, OR (US)

(*) Notice: Subject to any disclaimer, the term of this patent is extended or adjusted under 35 U.S.C. 154(b) by 37 days.

This patent is subject to a terminal disclaimer.

(21) Appl. No.: 12/583,092

(22) Filed: Aug. 13, 2009

(65) Prior Publication Data

US 2010/0052793 A1    Mar. 4, 2010

Related U.S. Application Data

(60) Provisional application No. 61/190,769, filed on Aug. 29, 2008.

(51) Int. Cl.
*H03F 3/04*    (2006.01)

(52) U.S. Cl. ......................................... 330/296

(58) Field of Classification Search .............. 330/296; 327/530; 257/565
See application file for complete search history.

(56) References Cited

U.S. PATENT DOCUMENTS

| | | | |
|---|---|---|---|
| 2,949,533 A | 8/1960 | Read | |
| 2,984,743 A | 5/1961 | Scott | |
| 3,060,329 A | 10/1962 | Harrison et al. | |
| 3,210,680 A | 10/1965 | Farris | |
| 3,254,303 A | 5/1966 | Brewer et al. | |
| 3,383,609 A | 5/1968 | Wheatley, Jr. | |
| 3,440,543 A | 4/1969 | Polzl | |
| 3,535,647 A | 10/1970 | Kozawa et al. | |
| 3,551,834 A | 12/1970 | Yamazaki et al. | |
| 3,560,768 A | 2/1971 | Rimkus | |
| 4,028,634 A | 6/1977 | Tentarelli | |
| 4,143,331 A | 3/1979 | Page | |
| 4,278,901 A | 7/1981 | Kishi | |
| 4,297,645 A | 10/1981 | Tanaka et al. | |
| 4,331,930 A | 5/1982 | Shibata et al. | |
| 4,713,628 A | 12/1987 | Nelson | |
| 5,033,032 A | 7/1991 | Houghtaling | |
| 5,196,809 A | 3/1993 | Fogal | |
| 5,430,413 A | 7/1995 | Fogal | |
| 5,502,421 A * | 3/1996 | Nakahara | 333/81 R |
| 6,781,108 B2 * | 8/2004 | Fujino | 250/214 A |
| 7,071,782 B2 * | 7/2006 | Delpy | 330/284 |
| 2005/0179436 A1 | 8/2005 | Park | |
| 2010/0019350 A1 | 1/2010 | Park | |
| 2010/0052793 A1 * | 3/2010 | Park | 330/296 |

OTHER PUBLICATIONS

Carpinelli, Joseph M., et al., "Direct observation of a surface charge density wave," Nature 381, 398-400, May 30, 1996, 2 pages.
ChargeDensityWave, "But it moves! (charge density wave in a metal)," http://www.princeton,edu/~npo/ChargeDensityWave.html, 2 pages, Date Unknown.
Fogal, Bill, "The Truth Behind Charged Barrier Technology," Copyright 1997, 37 pages.
"Spin density wave," From Wikipedia, the free encyclopedia, http://en.wikipedia.org/wiki/Spin, 2 pages, Date Unknown.

* cited by examiner

*Primary Examiner* — Robert Pascal
*Assistant Examiner* — Khiem Nguyen
(74) *Attorney, Agent, or Firm* — Chernoff Vilhauer McClung & Stenzel (57) ABSTRACT

The PN junctions of a transistor are biased for operation in the active mode but an initial flow of current reverses the bias of the base-emitter junction causing the transistor to conduct a resonant current with a voltage less than the forward junction voltage of said base-emitter.

22 Claims, 6 Drawing Sheets

RESONANT OPERATING MODE FOR A TRANSISTOR

CROSS-REFERENCE TO RELATED APPLICATIONS

This application claims the benefit of U.S. Provisional App. No. 61/190,769, filed Aug. 29, 2008.

BACKGROUND OF THE INVENTION

The present invention relates a transistor operating mode and, more specifically, to operation of a transistor in a resonant mode which is communicable with minimal loss to an attached device.

A junction transistor is a three layer sandwich of semiconductor material. The outer layers of the sandwich, respectively, the base and the emitter comprise a first type semiconductor material either a P-type or N-type material. Each outer layer is in contact with a central layer, the base, which comprises the second type of semiconductor material. The interface of the collector and the base forms a first PN junction, the collector-base junction, and the interface between the emitter and base forms a second PN junction, the base emitter junction. Transistors are typically used to switch and/or amplify electronic signals. The flow of a relatively large current between the collector and the emitter of the transistor can be controlled by application of a small voltage or current to the transistor's base.

By varying the bias, the voltage across the respective collector-base and base-emitter junctions, transistors can be operated in one or more of a plurality of commonly known modes When an NPN transistor is operated in the active mode, enabling a flow of current between the collector and the emitter, the collector-base junction is reverse biased, that is, the electrical potential at the collector is higher than the potential at the base, and the base-emitter junction is forward biased, that is, the electrical potential at the base exceeds the potential at the emitter by the junction forward voltage of a silicon PN junction. On the other hand, if the differential in electrical potential across the base-emitter junction is or becomes less than the junction forward voltage, the base-emitter junction is said to be reverse biased and the transistor is in the cut-off or OFF mode. The flow of current between the collector and the emitter ceases. A sufficiently great reverse bias of the base-emitter junction can produce an avalanche breakdown of the transistor producing large currents and, potentially, damaging the device. Another mode of operation, the saturation mode, is the collector voltage decreases until the collector-base junction becomes forward biased and the current in the junction cannot further increase.

The inventor discovered a previously unknown and beneficial mode of transistor operation that enables a current to be conducted with extremely low loss to an attached device and causes the attached to device to perform in unexpected and useful ways.

DETAILED DESCRIPTION OF THE PREFERRED EMBODIMENT

A bipolar junction transistor is a three layer sandwich of semiconductor material. The outer layers of the sandwich, respectively, the collector (C) and the emitter (E) comprise a first type of semiconductor material either a P-type or N-type material. Each outer layer is in contact with a central layer, the base (B), which comprises a thin layer of the second type of semiconductor material. The interface of the collector and the base forms a first PN junction, the collector-base junction, and the interface between the emitter and the base forms a second PN junction, the base-emitter junction. Junction transistors can be operated in a plurality of commonly known modes by varying the bias, the voltage across the respective collector-base and base-emitter junctions. When an NPN transistor is operated in the active mode, enabling a flow of current between the collector and the emitter, the collector-base junction is reverse biased, that is, the electrical potential at the collector is higher than the potential at the base, and the base-emitter junction is forward biased, that is, the electrical potential at the base is approximately 0.7V, the junction forward voltage of a silicon PN junction, higher than the potential at the emitter. On the other hand, if the differential in electrical potential across the base-emitter junction is or becomes less than the junction forward voltage, the base-emitter junction is said to be reverse biased and the flow of current between the collector and the emitter will cease. The transistor said to be in the cut-off or OFF mode. A sufficiently great reverse bias of the base-emitter junction can produce an avalanche breakdown of the transistor producing large currents which can, potentially, damage the device. Another mode of operation, the saturation mode, is the result of excessive current flowing in the collector. As the collector current increases, the collector voltage decreases until the collector-base junction becomes forward biased and the current in the junction cannot further increase. While developing a sensor for detecting electromagnetic waveforms that precurse seismic events, the present inventor was surprised to discover a previously unknown and beneficial mode of transistor operation.

Figure 1:
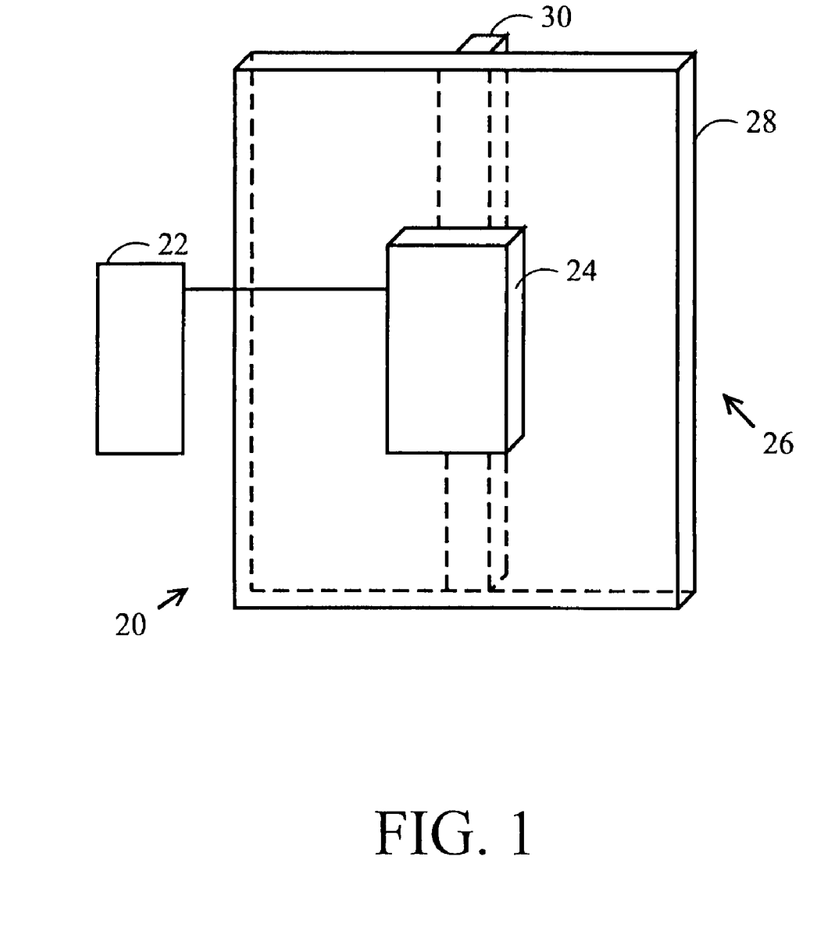
FIG. 1 is a block view of a seismic precursor detector.
Figure 2:
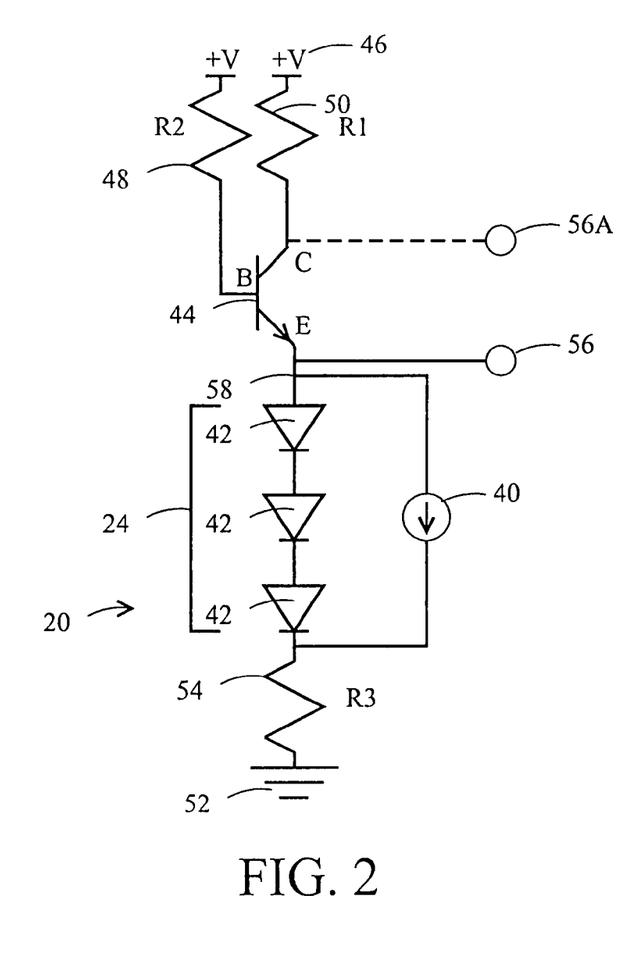
FIG. 2 is a schematic view of a seismic precursor sensor comprising an NPN transistor.

Referring in detail to the drawings where similar parts of the invention are identified by like reference numerals, and, more particularly to FIG. 1, an exemplary seismic precursor detector 20 comprises a transistor 22 that powers an amorphous silicon solar cell 24 which is attached to an antenna 26 for receiving electromagnetic seismic precursors. Referring specifically to FIG. 2, the detector 20 may be constructed with an NPN transistor 44 or, referring to FIG. 3, the detector may be constructed with a PNP transistor 46. The antenna comprises a metal plate 28 and may comprises a rod or a bar 30, typically having a rectangular cross section, attached to a metal plate by a non-conductive adhesive.

Figure 3:
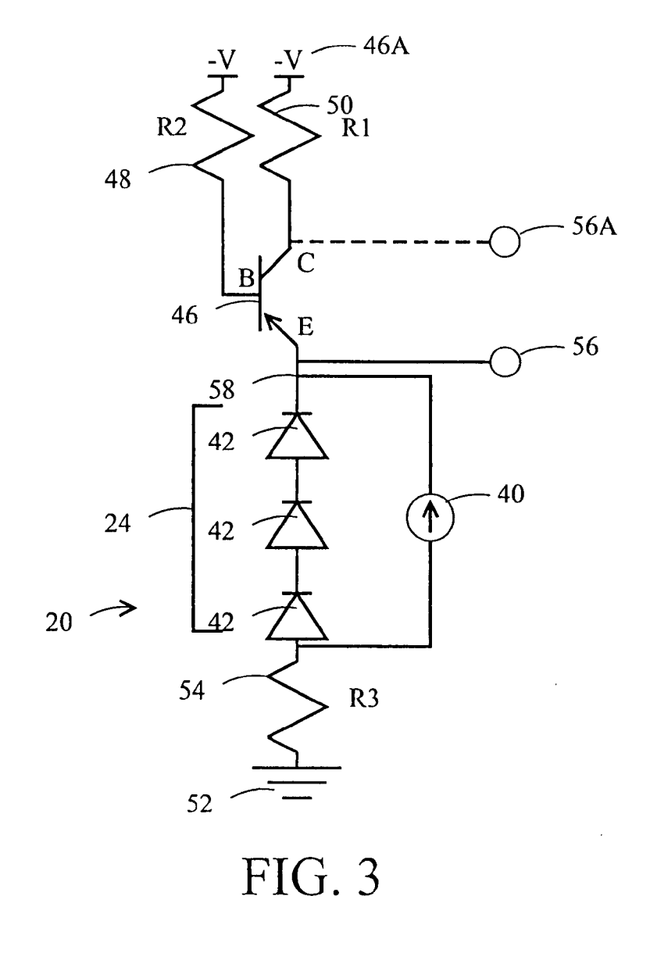
FIG. 3 is a schematic view of a seismic precursor sensor comprising a PNP transistor.

The transducer of the exemplary seismic precursor detector is the solar cell 24 which senses interaction of the antenna and electromagnetic radiation that precedes a seismic event and provides an electrical signal of that interaction. Referring to FIGS. 2 and 3, electrically, a solar cell 24 (indicated by a bracket) has the characteristics of a current source 40 connected in parallel with a plurality of diodes 42 that are connected in series. To insure that the solar cell of the detector is reacting to the electromagnetic radiation in the antenna, the light sensitive regions of the solar cell are covered with an opaque material, such as black plastic electrical tape, to prevent a photoelectric output by the solar cell.

Interaction of the silicon of the solar cell with radiation from the antenna increases the difference in electrical potential across the diodes. The solar cell acts as an open circuit when the voltage differential across the semiconductor junctions of the diodes comprising the solar cell is less than the junction forward voltage of the diodes, approximately 0.4-0.5 volts (V) per junction. When the difference in potential exceeds the junction forward voltage, the diodes arranged for forward operation become, ideally, a short circuit enabling current to conduct between the emitter of the transistor and ground. The inventor anticipated that the forward operated solar cell would provide a sensitive and consistent transducer.

The transistor of the detector is connected for operation in the active mode so that it will conduct a small current when the diodes of the solar cell become conductive in response to detection of interaction of electromagnetic radiation with the antenna. A reverse bias at the collector-base junction is provided by connecting the base of the transistor to a source of electrical potential 46, 46A through a resistor (R2) 48 having a higher resistance, for example, 1-30 Mega-ohm (MΩ), than the resistor (R1) 50, for example, 1 kilo-ohm (kΩ), connecting the collector to a source of the same voltage that is connected to the base resistor (R1). The emitter is connectable to a source of lower electrical potential, a ground reference potential 52, through the solar cell 24 and a resistor (R3) 54 having a value of 1 MΩ to limit the current flow from the emitter. Interaction of the antenna with electromagnetic seismic precursors causes the diodes of the solar cell to become conductive and a small current to flow between the transistor's emitter and the lower ground reference potential producing a change in voltage at the transistor's collector and emitter. The output signal 56, 56A for the detector, for example a voltage change, may be sensed at the emitter (E) or the collector (C) of the detector's transistor 44, 46.

While experimenting with the improved seismic precursor detector, the present inventor was surprised to discover that the detector's transistor operated in a previously unknown mode and that the sensitivity of the detector's solar cell was substantially increased. When the solar cell interacts with electromagnetic radiation, the transistor conducts a small initial current but the inventor observed that the bias of transistor's base emitter junction would reverse which should have caused the transistor to enter the cut-off mode and stop conducting. However, the inventor was surprised to see that the transistor would conduct a low current even though the base-emitter junction was reverse biased by up to 3V, a voltage insufficient to cause the transistor to operate in the avalanche mode. Moreover, the voltage at the emitter was typically approximately 0.3V, substantially below the junction forward voltage of the silicon PN junctions of the transistor and the diodes of the solar cell.

Figure 10:
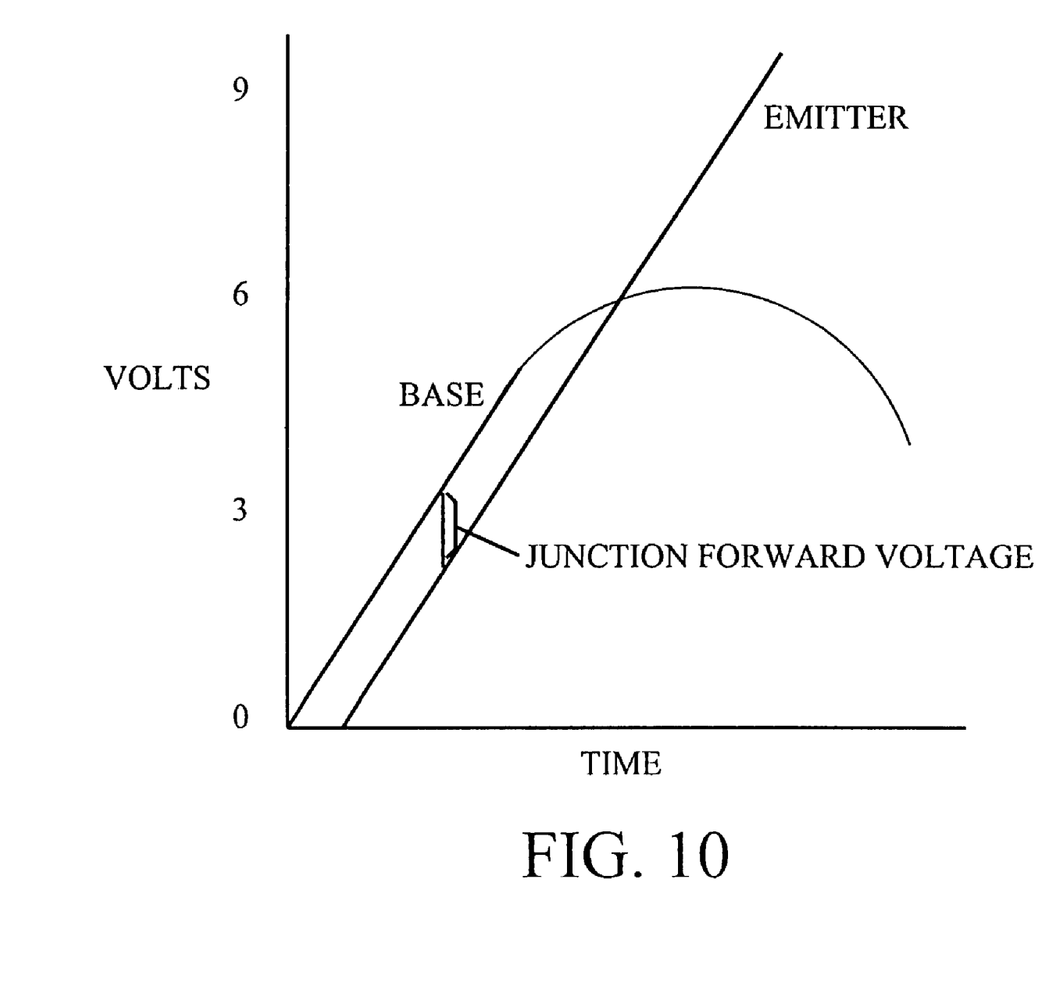
FIG. 10 is a graphical representation of base and emitter voltage versus time.

Referring to FIG. 10, while the precise mechanism producing this unexpected mode of transistor operation is uncertain, investigation into the unexpected behavior of the detector indicates that when the solar cell begins conducting the base and emitter are forward biased, that is, the base voltage exceeds the emitter voltage by the forward junction voltage. However, as current begins to flow in the emitter the rate of increase in the base voltage slows and the base-emitter junction becomes reverse biased. Although the base-emitter bias was reversed and the transistor should have been in the cut-off mode, the transistor had entered a resonant operating state in which it would conduct with a resonant frequency believed to be in excess of 100 Giga-hertz (Ghz). The inventor theorizes that with a base resistor, R2, that is much larger than the emitter resistor, R3, a very small current, possibly a few nano-amps, flows into the base through the reverse biased base-emitter junction. This current is amplified by collector gain increasing the voltage which causes the flow of current into the base to be interrupted. The cessation of current flow into the base reduces the voltage and the process repeats with the transistor oscillating internally in a coherent atomic resonance state having multiple harmonics.

The inventor was further surprised that the coherent resonate operating state of the transistor is communicable to devices attached to the transistor. For example, it was discovered that the diodes 42 comprising the solar cell 24 of the detector were conducting in the resonant state at approximately 0.1V, substantially below the junction forward voltage, the "turn-on" bias, of the silicon PN junctions of the diodes. When operating in the coherent resonant state, the sensitivity of the solar cell to electromagnetic seismic precursors increased by several orders of magnitude.

The inventor also discovered that the wire 58 connecting the transistor and the solar cell of the seismic detector conducts the high frequency resonance of the transistor to the solar cell with extremely low resistance, possibly superconduction at room temperature. The unexpected conductive performance was tested with a three to four inch long wire having a diameter of 0.0045 inches. While the precise mechanism is unknown, it is believed that a charge density wave, a periodic distortion of the ion lattice of a metal conductor, may be the mechanism communicating the coherent resonance of the transistor to a remotely located attached device.

Figure 4:
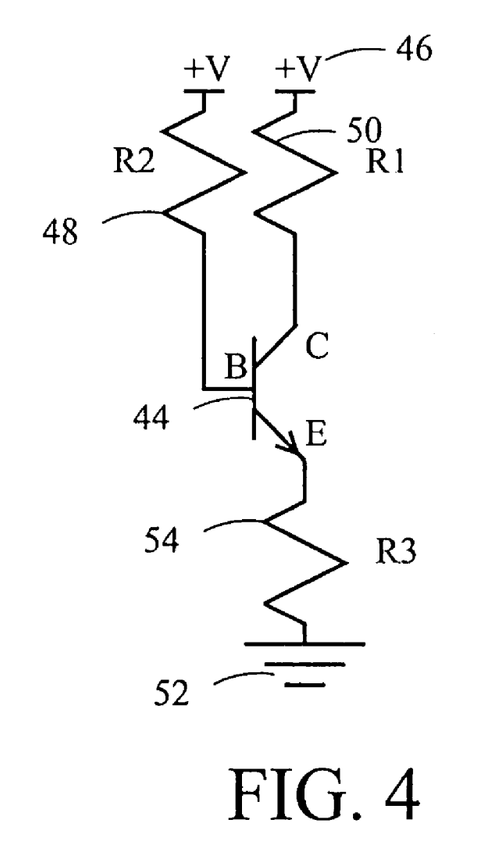
FIG. 4 is a schematic view of an NPN transistor circuit operable in the resonating mode.
Figure 5:
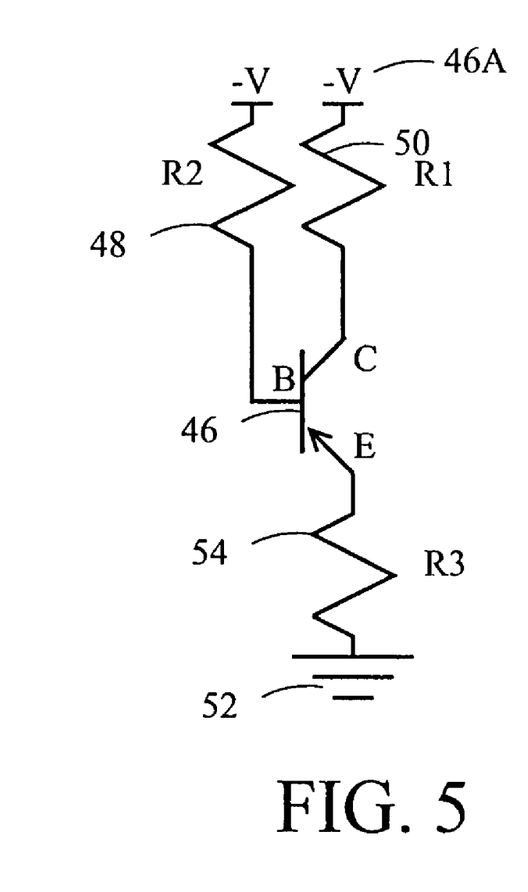
FIG. 5 is a schematic view of a PNP transistor circuit operable in the resonating mode.
Figure 6:
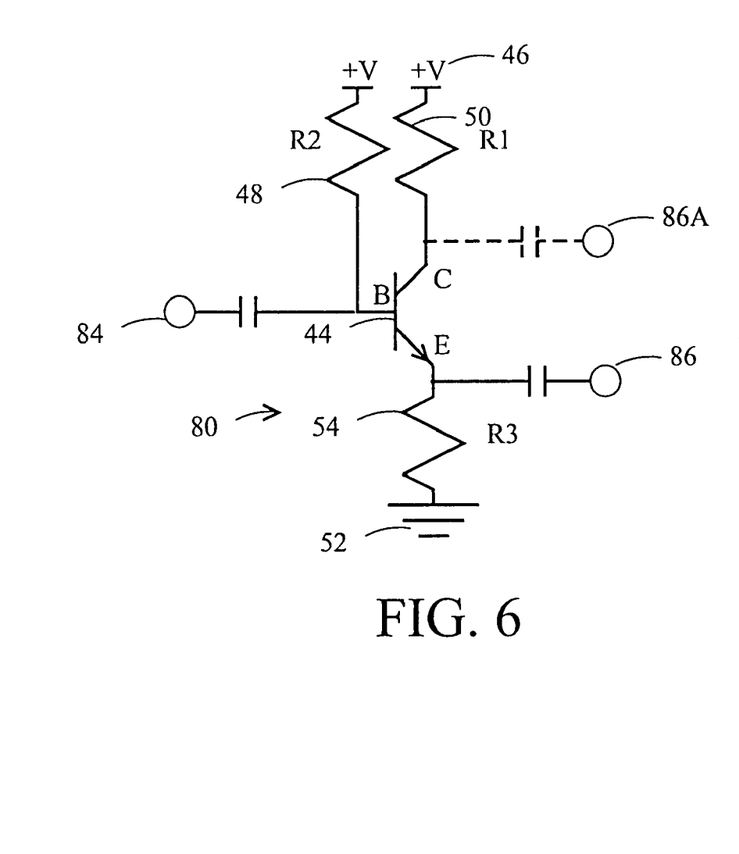
FIG. 6 is a schematic view of an amplifier including an NPN transistor.
Figure 7:
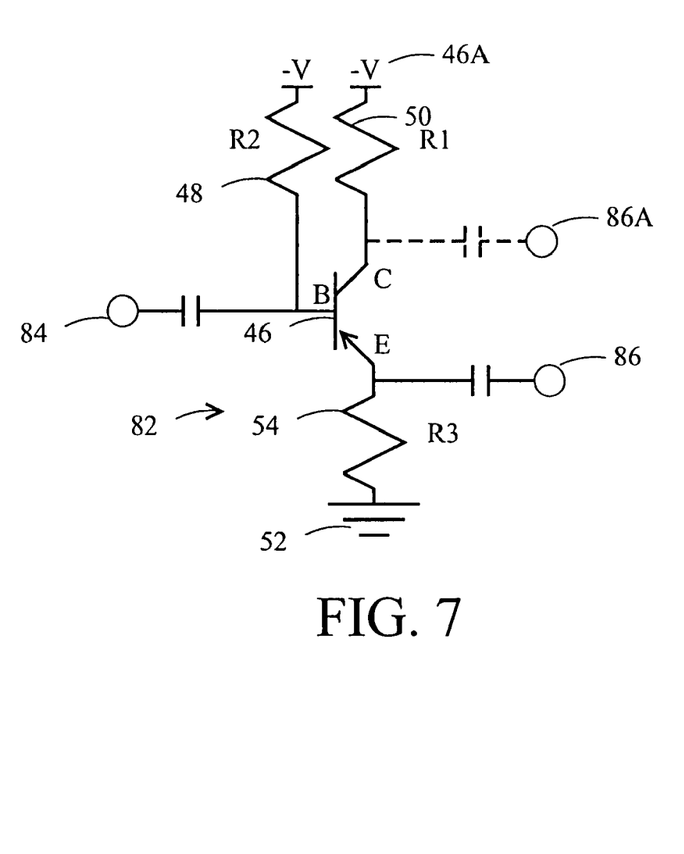
FIG. 7 is a schematic view of an amplifier including a PNP transistor.

While the resonant operating mode was discovered while experimenting with the seismic precursor detector, the inventor has determined that the resonating state is a transistor operating mode which can be induced when there is no semiconductor device, such as the diodes of the solar cell, connected to the emitter as illustrated in FIGS. 4 and 5. Testing by the inventor has demonstrated operation at frequencies up to 3 Ghz when operating in the coherent resonant mode, but the inventor believes that the transistor can be operated at much higher frequencies. The inventor expects that a transistor circuit, such as the amplifier 80 illustrated in FIG. 6 comprising a silicon NPN transistor 44 or the amplifier 82 illustrated in FIG. 7 constructed with a PNP transistor 46 may be operable at frequencies up to 100 Ghz in the coherent resonant mode. When operating in the coherent resonant mode, the input impedance of the transistor's base is very high enabling high frequency signals, in the range of 80-100 Ghz, to be conducted into the base with an unshielded wire instead of the customary transmission line with electromagnetic shielding. Alternatively, the input 86 may be connected at the emitter. The output of the amplifier may be derived from either the emitter or the collector 86A.

Figure 8:
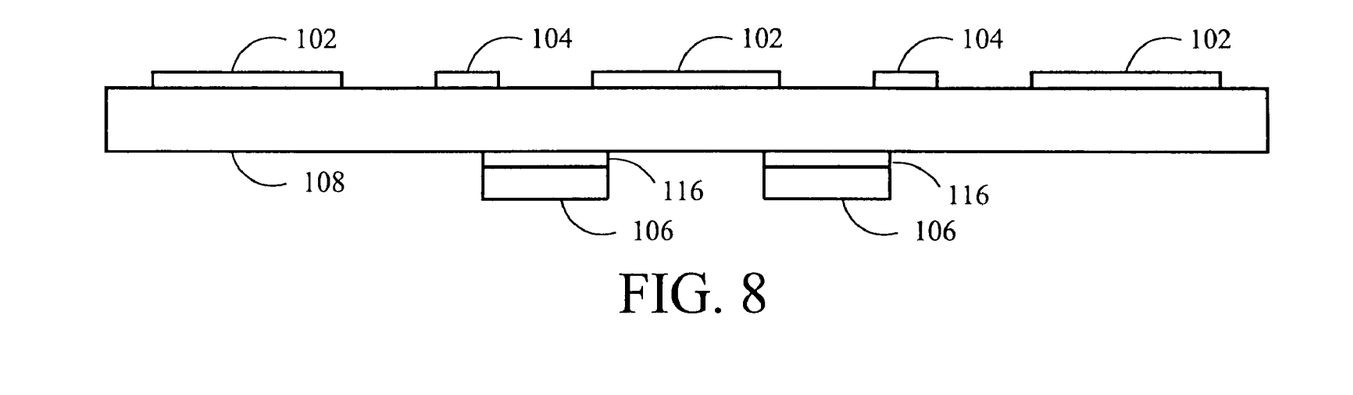
FIG. 8 is an elevation view of an integrated circuit die including a resonant mode transistor circuit.
Figure 9:
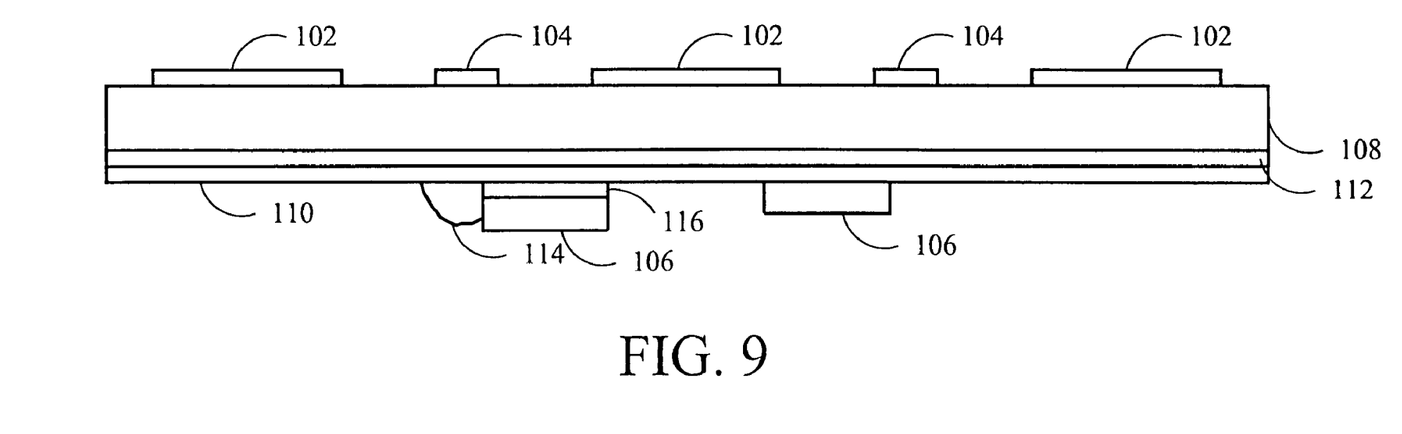
FIG. 9 is an elevation view of a second embodiment of an integrated circuit die including a resonant mode transistor circuit.

Referring to FIG. 8, the resonant operating state can be induced in the devices 102, including, by way of examples, optical semiconductor devices, field effect transistors (FET) and metal-oxide semiconductor field effect transistors (MOSFET), and conductors 104 of an integrated circuit (IC) 100 by attaching one or more resonating transistor circuits 106 to the substrate 108 of the die 100 on which the IC is fabricated or, as illustrated in FIG. 9, attaching the resonating transistor circuit to a conductive layer 110 attached to the substrate of the die. The conductive layer may be electrically isolated from the substrate by a dielectric layer 112. The resonating transistor circuits may be constructed on the surface of the substrate or conductor by integrated circuit techniques. To define the dimensions of the resonating charge density wave induced in the integrated circuit, the resonating transistor circuit may be connected to the die by feedback wire 114. The resonating circuit may be connected to the die with a capacitor 116 if the dc bias of the resonating circuit might conflict with the bias of the devices of the integrated circuit. The resonating operating state of the resonating transistor circuit is communicated to the substrate and the devices and conductors of the IC on the die enhancing the switching speed of the devices; including optical semiconductor devices, FETs, MOSFETs, and other transistors, and substantially reducing the losses associated with signal conduction in the integrated circuit.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

The invention claimed is:

1. A method of reducing signal attenuation in an electrical circuit, said method comprising the steps of:
    (a) connecting a semiconductor device to said electrical circuit;
    (b) connecting a constant polarity first electrical potential to bias a collector-base junction of said semiconductor device in a reverse direction; and
    (c) connecting a second electrical potential to an emitter of said semiconductor device, said second electrical potential arranged to bias a base-emitter junction of said semiconductor device in a forward direction producing an emitter current and causing said base-emitter junction to become biased in a reverse direction at potential insufficient to cause said semiconductor device to operate in an avalanche mode, thereafter said direction of said bias of said base-emitter junction reversing cyclically.

2. The method of reducing signal attenuation in an electrical circuit of claim 1 further comprising the step of affixing said semiconductor device to a substrate on which said electrical circuit is fabricated.

3. The method of reducing signal attenuation in an electrical circuit of claim 1 further comprising the steps of:
    (a) affixing a capacitor to a substrate on which said electrical circuit is fabricated; and
    (b) affixing said semiconductor device to said capacitor.

4. The method of reducing signal attenuation in an electrical circuit of claim 1 further comprising the step of affixing said semiconductor device to a conductive layer affixed to a substrate on which said electrical circuit is fabricated.

5. The method of reducing signal attenuation in an electrical circuit of claim 1 further comprising the steps of:
    (a) affixing a capacitor to a conductive layer of a substrate on which said electrical circuit is fabricated; and
    (b) affixing said semiconductor device to said capacitor.

6. The method of reducing signal attenuation in an electrical circuit of claim 5 further comprising the step of interconnecting said semiconductor device and said substrate with a feedback conductor.

7. The method of reducing signal attenuation in an electrical circuit of claim 1 further comprising the steps of:
    (a) affixing a dielectric to a substrate on which said electrical circuit is fabricated;
    (b) affixing a conductive layer to said dielectric; and
    (c) affixing said semiconductor device to said conductive layer.

8. The method of reducing signal attenuation in an electrical circuit of claim 7 further comprising the step of interconnecting said semiconductor device and said substrate with a feedback conductor.

9. The method of reducing signal attenuation in an electrical circuit of claim 1 further comprising the steps of:
    (a) affixing a dielectric to a substrate on which said electrical circuit is fabricated;
    (b) affixing a conductive layer to said dielectric;
    (c) affixing a capacitor to said conductive layer; and
    (d) affixing said semiconductor device to said capacitor.

10. The method of reducing signal attenuation in an electrical circuit of claim 9 further comprising the step of interconnecting said semiconductor device and said substrate with a feedback conductor.

11. The method of reducing signal attenuation in an electrical circuit of claim 1 wherein said semiconductor device and a device of said electrical circuit are interconnected with a conductor.

12. An electrical apparatus having reduced signal loss, said apparatus comprising:
    (a) an electric circuit;
    (b) a semiconductor device connected to said electrical circuit;
    (c) a constant polarity first electrical potential to arranged bias a collector-base junction of said semiconductor device in a reverse direction; and
    (d) a second electrical potential conductively to an emitter of said semiconductor device, said second electrical potential arranged to bias a base-emitter junction of said semiconductor device in a forward direction producing an emitter current and causing said base-emitter junction to become biased in a reverse direction at potential insufficient to cause said semiconductor device to operate in an avalanche mode, thereafter said direction of said bias of said base-emitter junction reversing cyclically.

13. The electrical apparatus of claim 12 wherein said semiconductor device is affixed to a substrate on which said electrical circuit is fabricated.

14. The electrical apparatus of claim 12 further comprising a capacitor affixed to a substrate on which said electrical circuit is fabricated and said semiconductor device is affixed to said capacitor.

15. The electrical apparatus of claim 12 wherein said semiconductor device is affixed to a conductor affixed to a substrate on which said electrical circuit is fabricated.

16. The electrical apparatus of claim 12 wherein said semiconductor device is affixed to a capacitor and said capacitor is affixed to a conductor affixed to a substrate on which said electrical circuit is fabricated.

17. The electrical apparatus of claim 16 further comprising a feedback conductor connecting said semiconductor device and said substrate.

18. The electrical apparatus of claim 12 further comprising:
   (a) a dielectric affixed to a substrate on which said electrical circuit is fabricated; and
   (b) a conductor affixed to said dielectric, said semiconductor device affixed to said conductor.

19. The electrical apparatus of claim 16 further comprising a feedback conductor connecting said semiconductor device and said substrate.

20. The electrical apparatus of claim 12 further comprising:
   (a) a dielectric affixed to a substrate on which said electrical circuit is fabricated;
   (b) a conductor affixed to said dielectric;
   (c) a capacitor affixed to said conductor, said semiconductor device affixed to said capacitor.

21. The electrical apparatus of claim 16 further comprising a feedback conductor connecting said semiconductor device and said substrate.

22. The electrical apparatus of claim 12 further comprising wherein said semiconductor device and another semiconductor device of said electrical circuit are interconnected with a conductor.

\* \* \* \* \*